United States Patent
Narukawa et al.

(10) Patent No.: US 7,926,010 B2
(45) Date of Patent: Apr. 12, 2011

(54) METHOD OF DETERMINING DEFECTS IN PHOTOMASK

(75) Inventors: Shogo Narukawa, Shinjuku-Ku (JP); Yoshikazu Nagamura, Chiyoda-Ku (JP)

(73) Assignees: Dai Nippon Printing Co., Ltd., Tokyo (JP); Renesas Technology Corp, Tokyo (JP)

( * ) Notice: Subject to any disclaimer, the term of this patent is extended or adjusted under 35 U.S.C. 154(b) by 268 days.

(21) Appl. No.: 12/131,582

(22) Filed: Jun. 2, 2008

(65) Prior Publication Data

US 2008/0301622 A1 Dec. 4, 2008

(30) Foreign Application Priority Data

Jun. 4, 2007 (JP) .................... 2007-148035

(51) Int. Cl.
 *G06F 17/50* (2006.01)
(52) U.S. Cl. ....................................... 716/100
(58) Field of Classification Search ................ 716/1, 19, 716/100
See application file for complete search history.

(56) References Cited

U.S. PATENT DOCUMENTS

2004/0107412 A1* 6/2004 Pack et al. ................ 716/19

FOREIGN PATENT DOCUMENTS

JP 2002-258463 A 9/2002

* cited by examiner

*Primary Examiner* — Jack Chiang
*Assistant Examiner* — Suchin Parihar
(74) *Attorney, Agent, or Firm* — Sughrue Mion, PLLC

(57) ABSTRACT

A method of determining defects in photomasks according to the present invention is designed to increase the yield of the manufacture of photomasks and to decrease the cost of inspecting the photomasks. In the method, circuit data 1 representing a circuit to be formed on a semiconductor substrate by photolithography is prepared, and layout data 2 is prepared from the circuit data 1. The layout data is converted to compensated layout data by performing RET. Further, mask-manufacturing data is developed from the compensated layout data. To form patterns on a semiconductor substrate by photolithography, attribute information is imparted to the mask-manufacturing data. The attribute information represents whether the patterns are adaptive to electrically active regions or electrically non-active region. In the mask-inspecting process 6, a criterion for determining whether the patterns formed on the photomasks have defects is changed in accordance with the attribute information.

10 Claims, 4 Drawing Sheets

FIG. 7
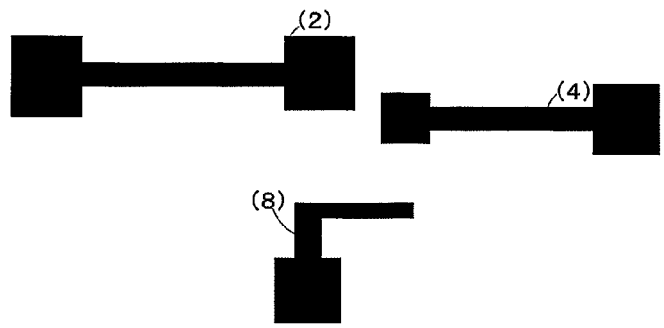
FIG. 8
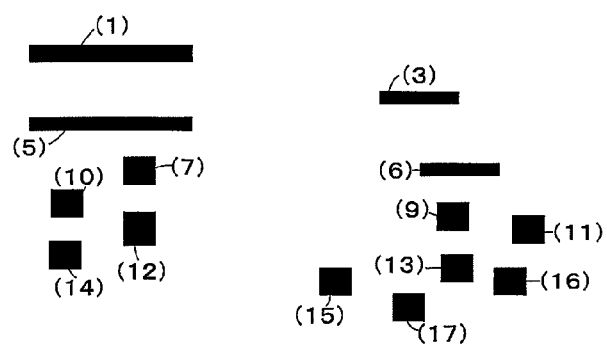
FIG. 9
Contents of the Connection-Information Table
|  | Layer 1 | Layer 2 | Connection layer |
|---|---|---|---|
| Definition 1 | GATE | METAL1 | CONT1 |
| Definition 2 | POLY | METAL1 | CONT2 |
| Definition 3 | METAL1 | METAL2 | VIA1 |
| Definition 4 | METAL2 | METAL3 | VIA2 |
| Definition 5 | METAL3 | METAL4 | VIA3 |
| Definition 6 | METAL4 | METAL5 | VIA4 |

METHOD OF DETERMINING DEFECTS IN PHOTOMASK

CROSS-REFERENCE TO RELATED APPLICATIONS

This application is based upon Japanese Patent Application No. 2007-148035, filed on Jun. 4, 2007, the specification, drawings and abstract of which are incorporated herein by reference.

BACKGROUND OF THE INVENTION

1. Field of the Invention

The present invention relates to a method of determining defects in photomasks for use in the manufacture of LSIs, which determines whether defects, if any, in a photomask may render the LISs defective.

2. Description of the Related Art

Photomasks for use in photolithography technology are getting more and more intricate, each having smaller and smaller elements arranged at a higher density, as LSIs have acquired higher integration density and become able to perform more functions in recent years. A photomask is a glass substrate on which a circuit pattern magnified four to five times has been printed by an electron-beam drawing apparatus. An exposure system projects reduced images of the circuit patterns to a silicon wafer, forming a circuit pattern on the silicon wafer. In recent years, LSIs have acquired higher integration density and become able to perform more functions. Now, as many as 50 to 70 photomasks are used to manufacture one LSI, in some cases. So many photomasks, which define the circuit pattern of an LSI, must be inspected, one by one, to see whether each satisfies the process precision demanded of it. Much labor and time are required to inspect photomasks, and the inspection cost is inevitably higher than the inspection cost of other products. Reportedly, the cost of inspecting photomasks amounts to about half the manufacturing cost of the photomasks.

An LSI is manufactured through a number of steps. First, its functions and logic are designed. Then, its circuit configuration is designed. Its circuit layout is designed. Based on the circuit layout, graphic data for forming photomask patterns (hereinafter also called design pattern data) are prepared. Using the design pattern data, photomasks are made. The patterns of the photomasks are transferred to a wafer by means of reduced projection exposure. Then, various processes are performed on the wafer, thereby manufacturing the LSI.

Most photomasks are prepared in the following method. First, in accordance with the design pattern data, an electron-beam exposure system or an excimer-wavelength photo exposure system applies a beam to the photosensitive resist coated on a light-shielding film that is provided on a photomask substrate (also called photomask blank). The photoresist is developed and etched, thereby providing a photomask. The photomask thus provided is inspected in a defect-detecting apparatus. The photomask, if found defective, is set in a defect-correcting apparatus that is designed to eliminate the defects.

A photomask is examined for defects by comparing the photomask with the design pattern data, or with a mask-drawing pattern data or an inspection pattern data prepared from the design pattern data, or by comparing the common patterns existing in the photomask with one another. Defects are detected at a defect-detection sensitivity set at the defect-detecting apparatus. The defect-detection sensitivity is defined by the size of the smallest defect the apparatus can detect. The defect-correcting apparatus performs a defect-removing process using a laser beam or an ion beam, or a defect-correcting process using focused-ion-beam assisted CVD, in order to illuminate the defects. The defects can hardly be perfectly corrected, however. When the photomask is inspected again, the defects may be detected again in some cases.

As mentioned above, the photomask is getting more and more intricate, each having smaller and smaller elements arranged at a higher density, as LSIs have acquired higher integration density and become able to perform more functions in recent years. In the case of a photomask complying with the 90-nm-to-45-nm rule applied to wafers, all defects detected by the defect-detecting apparatus cannot be corrected. Thus, it is difficult to provide photomasks that can pass the inspection that is performed at a prescribed defect-detection level. As pointed out above, the cost of inspecting photomasks amounts to a large part of the manufacturing cost of the photomasks. In view of this, it is demanded that the photomasks be inspected at as high an efficiency as possible.

JP-2002-258463-A, for example, discloses a method of inspecting photomasks, in which a defect-detecting apparatus compares the photomask pattern with the mask-drawing pattern data, thereby to detect defects, if any, in the photomask pattern. The mask-drawing pattern data includes graphic pattern data (i.e., drawing data) and graphic pattern data arrangement data (i.e., drawing-position data for the graphic pattern data), and has been subjected to optical proximity correction (OPC). From the mask-drawing data, intricate graphic patterns not OPC-corrected (e.g., test-element group (TEG) patterns) are previously extracted because these intricate graphic patterns are often detected as defective parts, though they should not be detected as such. Thus, in the process of inspecting the photomask pattern, the intricate graphic patterns are not detected as defective parts.

In the method disclosed in the above-identified publication, only the intricate graphic patterns (e.g., test-element group (TEG) patterns), which are often detected as detective parts in the process of inspecting the photomask pattern, though should not be detected as such, are previously extracted from the mask-drawing data that have been subjected to optical proximity correction (OPC). However, whether this or that graphic pattern should not be detected as a defective part is not necessarily based on the circuit pattern to be formed on the semiconductor substrate. Consequently, the criterion for selecting patterns that should not be detected as defective parts is not optimal.

SUMMARY OF THE INVENTION

The present invention has been made in order to solve the problem specified above.

The invention described in claim 1 is a method of determining defects in photomasks manufactured in a mask-manufacturing apparatus, in accordance with mask-manufacturing data for manufacturing a plurality of masks. The method has: a step of preparing circuit data that represents a circuit to be formed on a semiconductor substrate by means of photolithography; a step of preparing layout data that has been developed from the circuit data and that represents the layout of a plurality of layers, which defines the circuit and which is to be formed on the semiconductor substrate, one above another; a step of preparing compensated layout data for the layers, by adding compensation data to the layout data representing the layout of the layers; and a step of preparing mask-manufacturing data that has been developed from the compensated layout data for the layers and that has been used to manufacture the masks for the layers. The method further comprises: a step of extracting patterns adaptive to active regions and non-active regions in order to form electrically active regions and electrically non-active regions when a certain pattern on the photomask is formed by photolithography on the semiconductor substrate, in accordance with a connection-information table that describes a connection between circuit patterns represented by the layout data for the layers; a step of imparting attributes to all patterns represented by the mask-manufacturing data for manufacturing masks for the layers, the attributes showing whether the patterns are adaptive to active regions or non-active region; and a step of changing a criterion for determining whether the patterns formed on the photomasks have defects, in accordance with the attributes imparted to the patterns represented by the mask-manufacturing data for manufacturing masks for the layers.

The invention described in claim 2 is the method described in claim 1, in which the connection-information table may be a table that describes connection between the layers in which the patterns are provided.

The invention described in claim 3 is the method described in claim 1, in which compensation may be performed by optical proximity correction in the step of preparing compensated layout data for the layers.

The invention described in claim 4 is the method described in claim 1, in which compensation may be performed by phase shifting process in the step of preparing compensated layout data for the layers.

The invention described in claim 5 is the method described in claim 1, in which attributes that accord with the type of patterns adaptive to the active regions are imparted to the patterns represented by the mask-manufacturing data for manufacturing the masks for the layers.

The invention described in claim 6 is the method described in claim 5, in which the type of the patterns adaptive to the active regions may be determined from circuit-connection information (text data defining wires constituting a circuit and signals at terminals).

The invention described in claim 7 is the method descried in claim 5, wherein the criterion for determining whether the patterns formed on the photomasks have defects may be changed in accordance with the attributes imparted to the type of the patterns adaptive to the active regions.

The invention described in claim 8 is the method descried in claim 6, wherein the criterion for determining whether the patterns formed on the photomasks have defects may be changed in accordance with the attributes corresponding to the type of the patterns adaptive to the active regions.

The invention described in claim 9 is the method descried in any of claims 1 to 8, wherein attributes corresponding to the type of patterns adaptive to the non-active regions may be imparted to the patterns represented by the mask-manufacturing data for manufacturing the masks for the layers.

The invention described in claim 10 is the method descried in claim 9, wherein the criterion for determining whether the patterns formed on the photomasks have defects may be changed in accordance with the attributes corresponding to the type of the patterns adaptive to the non-active regions.

BRIEF DESCRIPTION OF THE DRAWINGS

FIG. 7 is a further diagram showing the part of the pattern formed on the photomask and defined by mask-manufacturing data 4 according to the embodiment of the invention;

FIG. 8 is another diagram showing the part of the pattern formed on the photomask and defined by mask-manufacturing data 4 according to the embodiment of the invention; and FIG. 9 is a diagram showing the contents of a connection-information table included in mask-manufacturing data 4 according to the embodiment of the invention.

DETAILED DESCRIPTION OF THE PREFERRED EMBODIMENTS

Figure 1:
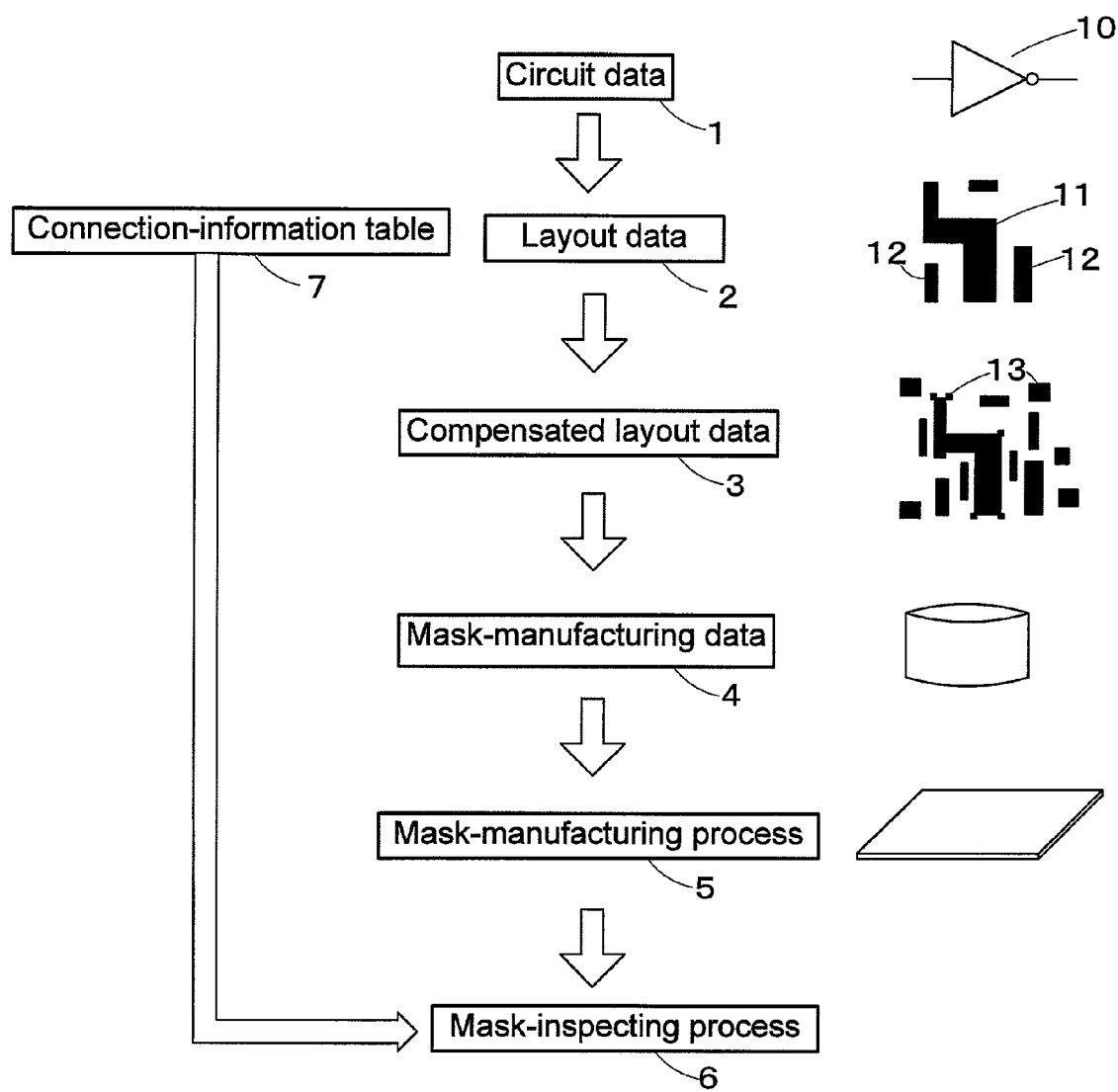
FIG. 1 is a diagram explaining a method of determining defects in photomasks, and also showing a flowchart that is referred to explain the method.

An embodiment of the present invention will be described with reference to the accompanying drawings. FIG. 1 is a diagram explaining a method of determining defects in photomasks, and showing a flowchart that is referred to explain the method. In FIG. 1, 1 denotes circuit data, 2 denotes layout data, 3 denotes a compensated data file, 4 denotes mask-manufacturing data, 5 denotes mask-manufacturing process, 6 denotes a mask-inspecting process, 7 denotes a connection-information table, 10 denotes a circuit diagram, 11 denotes circuit patterns, 12 denotes dummy patterns, and 13 denotes compensation patterns. The diagrams drawn beside the circuit data 1, layout data 2, compensated data file 3, mask-manufacturing data 4, and mask-manufacturing process 5 are no more than conceptual images of the corresponding files and processes, and do not illustrate concrete circuit configurations or circuit patterns at all.

With reference to the flowchart of the photomask manufacturing, a method of determining defects in the photomasks, according to the embodiment of this invention, will be explained below. The circuit data 1 is the design data about an LSI circuit such as ASIC. It represents a circuit configuration including, for example, a logic circuit of the circuit diagram 10. Instead, it may represent a lower-hierarchical order circuit, such as a transistor (circuit configuration element).

The layout data 2 has been developed from various items of circuit data 1. The layout data 2 represents the planer arrangement of circuit configuration elements and wires, all mounted on a semiconductor substrate, and the connection of circuit configuration elements existing in layers, one laid on another in the vertical direction. In other words, the layout data 2 hierarchically represents the circuit patterns for the respective layers that constitute an LSI specifically designed to be formed on a semiconductor substrate. Therefore, the layout data 2 consists of data items defining the layers and a connection-information table 7 defining the connection of circuit configuration elements existing in layers, one laid on another in the vertical direction. Assume that the LSI is composed layers 1, 2, 3, and so on. Then, the connection-information table 7 contains the information showing, for example, "the layer 2 connects the layers 1 and 3."

In the process of developing the layout data 2 from the items of circuit data 1, the dummy patterns 12 are used in addition to the circuit patterns 11 defining circuit configuration elements (parts) or wires. The dummy patterns 12 are available in various types, which may be selected and used for a particular purpose.

Some types of dummy patterns provided, merely to facilitate the design change of the LSI, from a certain specification to another, and not used at all in manufacturing an LSI of any selected specification. Such a dummy pattern (more precisely called, dummy gate pattern) is a circuit pattern that defines a dummy transistor or the like. In order to suppress the magnetic field developing around, for example, the power-line pattern, dummy patterns may be provided, extending on both sides of the power supply line path. Thus, dummy patterns 12 are used together with the circuit patterns 11 for various purposes. The information including the dummy patterns 12 is contained in the layout data 2.

The compensated data file 3 consists of the layout data 2 (i.e., data items defining the layers) and compensation data items added to the respective layer data items. The state-of-the-art exposure apparatus has an ArF light source (wavelength: 193 nm) and can apply a beam having a width of 90 nm. An exposure process is planned for near-future use, in which such a light source is used to apply a beam having a width of 65 nm. In order to perform exposure using a beam that has a width equal to smaller than half the light-source wavelength, some compensation is indispensable. To this end, the photomask used in the exposure incorporates technology of enhancing the resolution, called resolution enhancement technology (RET). Well known as a RET is optical proximity correction (OPC). The compensated data file data 3 (i.e., layout data 2 thus compensated) is, so to speak, a combination of the circuit patterns 11, dummy patterns 12 and compensation patterns 13.

Then, the mask-manufacturing data 4 that has been developed from the compensated data file data 3 representing the patterns of several layers and that has been used to manufacture the masks for the layers is prepared. In the mask-manufacturing process 5, the mask-manufacturing data 4 is used in a photomask-manufacturing apparatus, more precisely in an electron-beam exposure system or an excimer-wavelength photo exposure system. The system applies a beam to the photosensitive resist coated on a light-shielding film that is provided on a photomask substrate (also called photomask blank), drawing the circuit pattern on the resist. The resist is developed and etched, whereby a photomask is provided.

In the mask-inspecting process 6, the photomask is inspected in a defect-detecting apparatus. The defect-detecting apparatus compares the pattern formed on the photomask, either with the design pattern data or with the mask-drawing pattern data or inspection pattern data prepared from the design pattern data. In the present embodiment of this invention, the pattern formed on the photomask is compared with, for example, the mask-manufacturing data 4, and any part of the photomask, the pattern of which does not accord with the mask-manufacturing data 4, is determined to be defective.

In the mask-inspecting process 6, the pattern formed on the photomask is compared with the mask-manufacturing data 4. The mask-manufacturing data 4 has property (also called attribute information), based on which to set the criterion for determining whether the photomask has defects. The criterion is set in accordance with whether the pattern formed on the photomask by photolithography is adaptive to electrically active regions of the semiconductor substrate or to electrically non-active regions of the semiconductor substrate. Whether the pattern is adaptive to electrically active regions or electrically non-active regions is determined in accordance with the connection-information table 7 that defines the connection of circuit configuration elements existing in layers. Thus, the criterion is set based on the property of the mask-manufacturing data 4.

In the mask-manufacturing process 5, the criterion is set on the property that has been set as described above. That is, the criterion for determining whether the photomask has defects is changed in accordance with whether the pattern represented by the mask-manufacturing data 4 has the property of the pattern adaptive to electrically active regions or the property of the pattern adaptive to the electrically non-active regions.

In the mask-inspecting process 6, the pattern formed on the photomask may be found not identical to the pattern the mask-manufacturing data 4 represents. If this is the case, the property of the pattern represented by the mask-manufacturing data 4 examined, determining whether the pattern has the property of the pattern that is adaptive to the electrically active regions. If the pattern has this property, it is adaptive to the electrically active regions. In this case, the pattern is one for forming the electric circuits constituting an LSI and is therefore particularly important. Hence, a strict criterion is set in the mask-inspecting process 6. On the other hand, if the pattern does not have the property, it is adaptive to the electrically non-active regions and is one for forming dummy patterns and compensation patterns. Since the pattern is not for forming the electric circuits constituting an LSI, a strict criterion is not set for the pattern in the mask-inspecting process 6.

In the present invention, the criterion for determining whether the pattern formed on the photomask has defects is changed in accordance with whether the pattern is used to form electrically active regions or electrically non-active regions. The criterion thus determined is therefore more appropriate than those determined by the conventional technique. Since the criterion is so changed, it is not strict for any pattern for forming non-active regions. This helps to increase the yield of the manufacture of the photomasks and to reduce the cost of inspecting the photomasks.

The concept of determining the property of the pattern formed on a photomask in the method of determining defects in the photomasks, according to the present embodiment of this invention, will be explained with reference to FIGS. 2 to 8. FIGS. 2 to 8 are diagrams showing a part of the pattern formed on the photomask and defined by the mask-manufacturing data 4 according to the embodiment of the invention. The sequence of determining the property of the part of the pattern on the photomask will be explained below.

Figure 2:
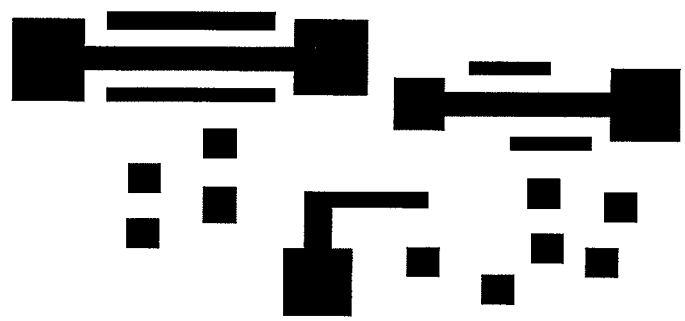
FIG. 2 is a diagram showing a part of the pattern formed on a photomask and defined by mask-manufacturing data 4 according to an embodiment of the invention.
Figure 3:
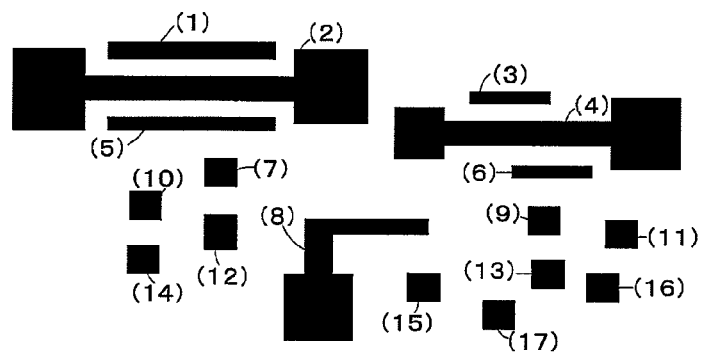
FIG. 3 is another diagram showing the part of the pattern formed on the photomask and defined by mask-manufacturing data 4 according to the embodiment of the invention.

FIG. 2 shows a part of the original pattern for the photomask, which is defined by the mask-manufacturing data 4. As shown in FIG. 3, serial numbers 1 to 17 are allocated to the elements of the original pattern on the photomask, respectively.

Figure 4:
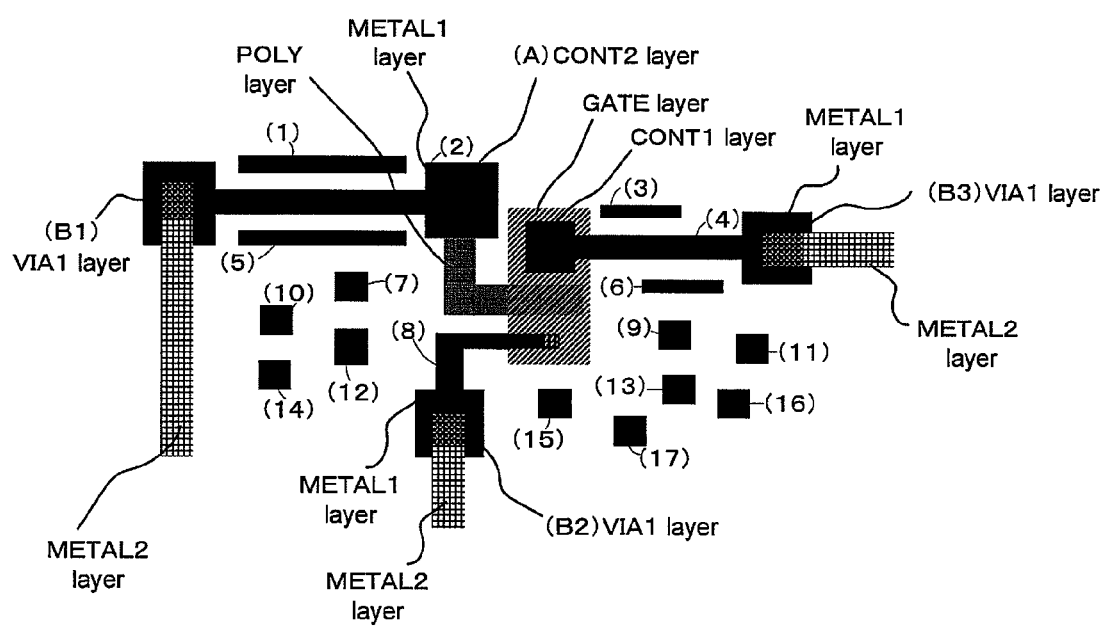
FIG. 4 is still another diagram showing the part of the pattern formed on the photomask and defined by mask-manufacturing data 4 according to the embodiment of the invention.

Then, the connection between the photomask being inspected and the other photomasks is determined from the connection-information table, as is illustrated in FIG. 4. In FIG. 4, the pattern of the photomask being inspected is indicated by black pattern elements, while the patterns of other photomasks are indicated by shaded pattern elements. The connection-information table defines, for example, layer C connects the layers A and B, as described above. Thus, which black pattern element is electrically connected to which pattern element of which photomask is determined from the connection-information table.

More specifically, definition 2 shown in the connection-information table of FIG. 9 describes that connection layer CONT2 should electrically connect layer POLY and layer METAL1. Therefore, part (A) electrically connects the layers POLY and METAL1 as illustrated in FIG. 4.

Figure 6:
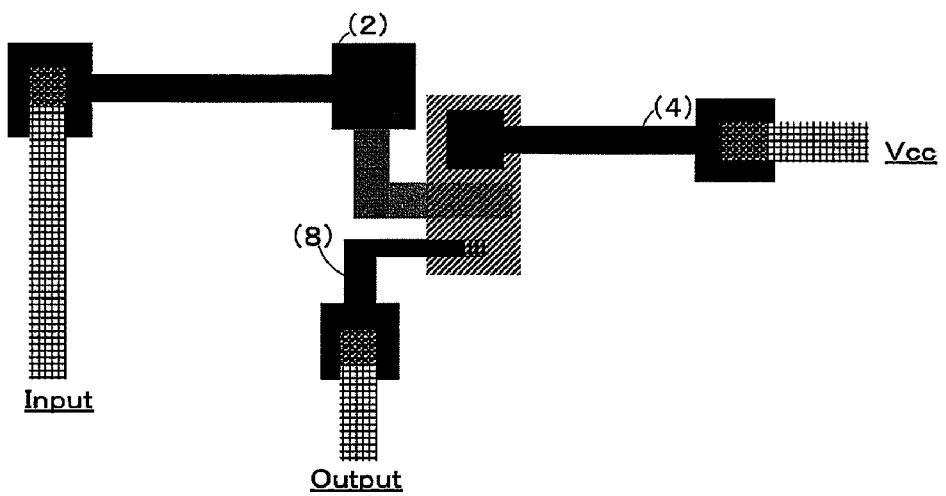
FIG. 6 is still another diagram showing the part of the pattern formed on the photomask and defined by mask-manufacturing data 4 according to the embodiment of the invention.

Definition 3 describes that connection layer VIA1 should electrically connect layer METAL1 and layer METAL2. Therefore, parts (B1), (B2) and (B3) are electrically connected to one another as shown in FIG. 4. Similarly, the other parts are electrically connected as defined in the connection-information table. As a result, such a pattern as shown in FIG. 6 can be extracted, which shows the connection of the pattern elements.

Figure 5:
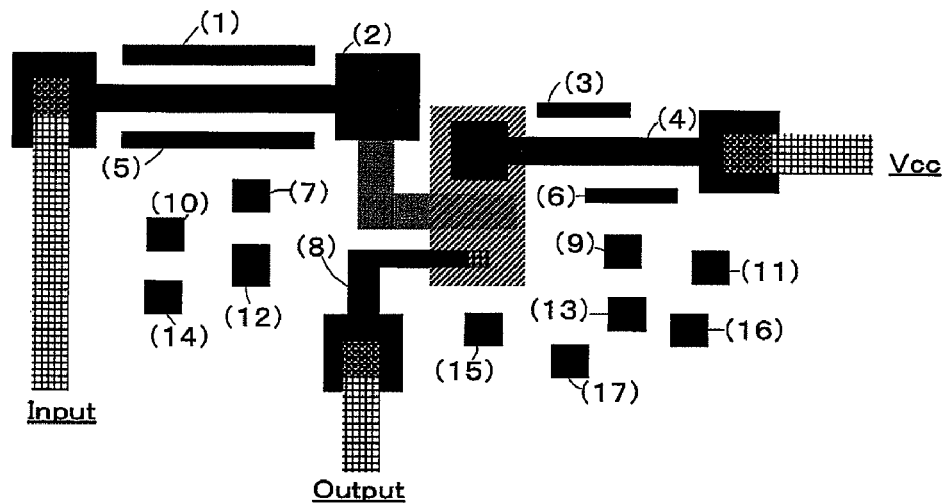
FIG. 5 is another diagram showing the part of the pattern formed on the photomask and defined by mask-manufacturing data 4 according to the embodiment of the invention.

Next, it is determined which wires defined by which pattern elements of all the photomasks should be connected to the input terminal (Input), output terminal (Output) and power-supply line (Vcc) of the LSI chip. The information about the input terminal, output terminal and power-supply line (Vcc) of the LSI chip is defined as pad information in the mask-manufacturing software that is actually used. The pad information includes text data items "Input," "Output," "Vcc" and the like including the position data, which are stored, each overlapping the data items representing the photomask-pattern elements as is illustrated in FIG. 5. Thus, the information shows which pattern elements correspond to wires that should be connected to the input terminal (Input), output terminal (Output) and power-supply line (Vcc).

Whether any pattern forms active regions or non-active regions is determined from the pad information and the connection-information table. Another method of determining this is to associate a layout exchange format (LEF) and a design exchange format (DEF) with the photomask pattern.

The sequence of processes, described above, defines a photomask pattern for forming the wires electrically connected to the input terminals (Input), output terminal (Output) and power-supply (Vcc) and for forming the circuit configuration elements connected to these wires. Thus, while the pattern formed on the photomask is being printed by photolithography on the semiconductor substrate, whether this pattern corresponds to electrically active regions or electrically non-active regions can be determined.

Now that the pattern has been determined to correspond to active regions or non-active regions, property is imparted to each pattern formed on the photomask, thus rendering the pattern adaptive to either active regions or non-active regions. The pattern shown in FIG. 7 has the property pertaining to active regions, and the pattern shown in FIG. 8 has the property pertaining to non-active regions.

In the embodiment described above, the criterion for determining whether the pattern formed on the photomask has defects is changed in accordance with whether the pattern is used to form electrically active regions or electrically non-active regions, in order to determine whether the pattern formed on the photomask has defects or not. In other words, the criterion is changed, depending on the type of regions, i.e., active regions or non-active regions, to which the pattern is adaptive. That is, the criterion involves only two events, one being that the pattern is adaptive to active regions, the other being that the pattern is adaptive to non-active regions.

Nonetheless, the criterion may involve three events or more.
This is because many patterns are available, which are adaptive to active regions, and many patterns are available, which are adaptive to non-active regions. Therefore, the criterion is changed in accordance with the most significant event.

Patterns adaptive to active regions are available in various types, which will be described. The pattern elements formed on the photomask and adaptive to active regions is used to form electrically conductive elements on the semiconductor substrate. Of the pattern elements, the most important are the elements for forming circuit configuration elements, and the second important are elements for forming wires on the semiconductor substrate. Of these wires, the most important is the clock line, critical line that must transfer data at high speed, the second important is signal lines, the third important is the power-supply line, and the least important is the ground line.

"Property of the circuit configuration elements," "property of the clock line," "property of the signal lines," and "property of the power-supply line" and "property of the ground line" are imparted to the pattern elements adaptive to the active regions of the photomask, respectively. In the mask-manufacturing process 5, the criterion for determining whether the pattern has defects is changed in accordance with the properties thus imparted to the pattern elements. More precisely, the defect-determining criterions for the circuit configuration elements, the clock line, the signal lines, the power-supply line and the ground line, respectively, are set, each less strict than the criterion mentioned immediately before.

It is advisable to impart proper ties to the various pattern data items about the photomask in accordance with the importance of the pattern element adaptive to each active region, in the process of developing the layout data 2 from the circuit data 1.

Types of the patterns adaptive to active regions will be described. Any pattern adaptive to a non-active region is used to form a component that is not electrically conducting. As described above, there are two types of such patterns. One is a compensation pattern for lithography (i.e., RET-compensating pattern), and the other is a dummy pattern. The pattern for use in RET may be one for the above-mentioned OPC or one for phase shifting. The dummy pattern is available in some types, which will be described later. The compensation pattern for lithography is more important than ordinary dummy patterns.

The dummy pattern is added to the circuit pattern defining the circuit configuration elements (parts) and wires when the layout data 2 is developed from the circuit data 1 as described above. The dummy pattern is available in various types, for various purposes. The importance of the dummy pattern of each type depends on the purpose for which the dummy pattern is used. Hence, the criterion for determining whether the pattern has defects may be changed before it is applied in the process of determining defects.

It is advisable to impart a property that accords to the importance of a dummy pattern to the pattern data about the photomask, in the process of developing the layout data 2 from the circuit data 1.

The purpose, for which the dummy pattern is used, will be explained. Assume that a dummy pattern is provided to facilitate the design change of an LSI, from a certain specification to another, and is not used at all to manufacture the LSI of the certain specification. Also assume that the dummy pattern defines a circuit configuration element such as a dummy transistor. This dummy pattern shall be called "dummy-circuit forming dummy pattern."

Dummy patterns of another type are provided, extending on both sides of the power-supply line path or the like. These dummy patterns shield the magnetic field developing around, for example, the power-line pattern. Such a dummy pattern shall be called "shielding dummy pattern."

To manufacture a semiconductor device having wiring layers laid one above another, the wires constituting each wiring layer may be formed by filling trenches with metal. In this case, chemical mechanical polishing (CMP) is performed, removing unnecessary part of the metal and leaving necessary part of metal in the trenches. The CMP rate changes, from one part of the wiring layer to another part thereof, because of the in-plane uniformity of the wiring pattern. Due to this change of CMP rate, the wire elements in each wiring layer may differ in thickness. To prevent the wire elements from differing in thickness, a dummy pattern is formed on each wiring layer in most cases. The dummy pattern is formed in the same way as a wiring pattern, as a pseudo pattern in a region where the elements of the wiring pattern are sparsely arranged. Such a dummy pattern shall be called "CMP-compensating dummy pattern."

Another type of a dummy pattern is provided, surrounding the circuit configuration elements, thus preventing electrostatic breakdown of the circuit configuration elements. Such a dummy pattern shall be called "electrostatic-breakdown preventing dummy pattern."

The patterns adaptive to non-active regions may be summarized as follows. "Property of the RET-compensating pattern," "property of the dummy-circuit forming dummy pattern," "property of the shielding dummy pattern", "property of the CMP-compensating dummy pattern," and "property of the electrostatic-breakdown preventing dummy pattern" are imparted to the pattern elements adaptive to the non-active regions of the photomask, respectively. In the mask-manufacturing process 5, the criterion for determining whether the pattern has defects is changed in accordance with the properties thus imparted to the pattern elements. More precisely, the defect-determining criteria for the "property of the RET-compensating pattern", "property of the dummy-circuit forming dummy pattern", "property of the shielding dummy pattern", "property of the CMP-compensating dummy pattern" and "property of the electrostatic-breakdown preventing dummy pattern", respectively, are set, each less strict than the criterion mentioned immediately before.

Of these properties, the "property of the RET-compensating pattern" is most important. The criterion for determining whether the RET-compensating pattern has defects is therefore the strictest. Nonetheless, it is not always optimal to set the criteria for determining whether the other dummy patterns have defects, as described in the preceding paragraph. The strictness order specified in the preceding paragraph is nothing more than an example.

In the present invention, the criterion for determining whether the pattern has defects is changed in accordance with the properties imparted to the pattern elements adaptive to the active regions and the properties imparted to the pattern elements adaptive to the non-active regions. Thus, whether the pattern has defects can therefore be determined in accordance with a more appropriate criterion than in the conventional method. Since the criterion so changed is not strict, the yield of the manufacture of the photomasks can increase and the detecting cost of the photomasks can decrease.

In the present invention, properties are imparted to various types of patterns in order to distinguish the patterns adaptive to active-regions from those adaptive to non-active regions. Nonetheless, each pattern adaptive to an active-region may be distinguished from a pattern adaptive to a non-active region, for example in accordance with the layer number of the layout data, the data type of the layer, the cell name, or a file name.

What is claimed is:

1. A method of determining defects in photomasks manufactured in a mask-manufacturing apparatus on the basis of mask-manufacturing data for manufacturing a plurality of masks, the method having:
   a step of preparing circuit data that represents a circuit to be formed on a semiconductor substrate by means of photolithography;
   a step of preparing layout data that has been developed from the circuit data and that represents the layout of a plurality of layers, which defines the circuit and which is to be formed on the semiconductor substrate, one above another;
   a step of preparing compensated layout data for the layers, by adding compensation data to the layout data representing the layout of the layers; and
   a step of preparing mask-manufacturing data that has been developed from the compensated layout data for the layers and that has been used to manufacture the masks for the layers,
   the method further comprising:
   a step of extracting patterns adaptive to active regions and non-active regions in order to form electrically active regions and electrically non-active regions when a certain pattern is formed by photolithography on the semiconductor substrate, in accordance with a connection-information table that describes a connection between circuit patterns represented by the layout data for the layers;
   a step of imparting attributes to all patterns represented by the mask-manufacturing data for manufacturing masks for the layers, the attributes showing whether the patterns are adaptive to active regions or non-active region; and
   a step of changing a criterion for determining whether the patterns formed on the photomasks have defects depending on whether each of the patterns correspond to an active region or a non-active region, in accordance with the attributes imparted to the patterns represented by the mask-manufacturing data for manufacturing masks for the layers.

2. The method of determining defects in photomasks according to claim 1, wherein the connection-information table is a table that describes connection between the layers in which the patterns are provided.

3. The method of determining defects in photomasks according to claim 1, wherein compensation is performed by optical proximity correction in the step of preparing compensated layout data for the layers.

4. The method of determining defects in photomasks according to claim 1, wherein compensation is performed by phase shifting in the step of preparing compensated layout data for the layers.

5. The method of determining defects in photomasks according to claim 1, wherein attributes that accord with the type of patterns adaptive to the active regions are imparted to the patterns represented by the mask-manufacturing data for manufacturing the masks for the layers.

6. The method of determining defects in photomasks according to claim 5, wherein the type of the patterns adaptive to the active regions is determined from circuit-connection information (text data defining wires constituting a circuit and signals at terminals).

7. The method of determining defects in photomasks according to claim 5, wherein the criterion for determining whether the patterns formed on the photomasks have defects is changed in accordance with the attributes imparted to the type of the patterns adaptive to the active regions.

8. The method of determining defects in photomasks according to claim 6, wherein the criterion for determining whether the patterns formed on the photomasks have defects is changed in accordance with the attributes corresponding to the type of the patterns adaptive to the active regions.

9. The method of determining defects in photomasks according to any one of claim 1 to 8, wherein attributes corresponding to the type of patterns adaptive to the non-active regions are imparted to the patterns represented by the mask-manufacturing data for manufacturing the masks for the layers.

10. The method of determining defects in photomasks according to claim 9, wherein the criterion for determining whether the patterns formed on the photomasks have defects is changed in accordance with the attributes corresponding to the type of the patterns adaptive to the non-active regions.

* * * * *